United States Patent
Shen et al.

(10) Patent No.: US 9,831,884 B2
(45) Date of Patent: Nov. 28, 2017

(54) ADAPTIVE CONFIGURATION TO ACHIEVE LOW NOISE AND LOW DISTORTION IN AN ANALOG SYSTEM

(71) Applicant: Synaptics Incorporated, San Jose, CA (US)

(72) Inventors: Dan Shen, Irvine, CA (US); Lorenzo Crespi, Costa Mesa, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 15/476,826

(22) Filed: Mar. 31, 2017

(65) Prior Publication Data

US 2017/0288690 A1    Oct. 5, 2017

Related U.S. Application Data

(60) Provisional application No. 62/316,498, filed on Mar. 31, 2016.

(51) Int. Cl.
*H03M 1/06* (2006.01)
*H03M 1/08* (2006.01)

(52) U.S. Cl.
CPC ....... *H03M 1/0617* (2013.01); *H03M 1/0614* (2013.01); *H03M 1/08* (2013.01)

(58) Field of Classification Search
CPC ..... H03M 1/08; H03M 1/0614; H03M 1/0617

USPC .................................................. 341/118–155
See application file for complete search history.

(56) References Cited

U.S. PATENT DOCUMENTS

| | | | |
|---|---|---|---|
| 6,453,289 B1* | 9/2002 | Ertem | G10L 21/0208 704/225 |
| 9,246,503 B1* | 1/2016 | Hamilton | H03M 1/1085 |
| 9,319,805 B2* | 4/2016 | Griffin | H04R 25/50 |
| 2004/0070917 A1* | 4/2004 | Michalski | H03H 19/004 361/256 |
| 2010/0259434 A1* | 10/2010 | Rud | H03M 1/08 341/155 |
| 2014/0210653 A1* | 7/2014 | Harpe | H03M 1/02 341/110 |
| 2016/0344401 A1* | 11/2016 | La Grou | H03M 1/08 |
| 2017/0089952 A1* | 3/2017 | Davis | G01R 1/14 |

* cited by examiner

*Primary Examiner* — Lam T Mai
(74) *Attorney, Agent, or Firm* — Haynes and Boone, LLP (57) ABSTRACT

Noise and distortion reduction in a signal processed through analog circuitry includes providing noise reduction circuitry to reduce signal noise generated by at least one analog circuit element. The noise reduction circuitry is adaptively configured to adjust a rate to apply noise reduction to the signal without introducing unwanted distortion. Distortion reduction circuitry is adaptively configured to adjust a rate to apply distortion reduction to the signal without introducing unwanted noise. The signal is processed through the analog circuitry using the adaptively configured noise reduction circuitry and adaptively configured distortion reduction circuitry to reduce both noise and distortion in the signal.

20 Claims, 4 Drawing Sheets

FIG. 4

ADAPTIVE CONFIGURATION TO ACHIEVE LOW NOISE AND LOW DISTORTION IN AN ANALOG SYSTEM

CROSS-REFERENCE TO RELATED APPLICATION

The present application claims priority to U.S. provisional patent application No. 62/316,498 filed Mar. 31, 2016, which is fully incorporated by reference as if set forth herein in its entirety.

BACKGROUND

Technical Field

The present disclosure generally relates to signal processing and, more particularly, to systems and method for achieving low noise and distortion in an analog system.

Background

Analog signal processing systems are known to add noise and distortion to an input signal as it passes through the analog circuitry, thereby degrading the signal quality. It is desirable to reduce both noise and distortion from the processed input signal. However, techniques for reducing noise may increase distortion, and techniques for reducing distortion may increase noise. Thus, there is a need in the art for improved signal processing solutions that reduce both noise and distortion.

SUMMARY

In accordance with embodiments set forth herein, various techniques are provided for reducing both noise and distortion in analog signal processing systems. In one embodiment, a method for reducing noise in a signal processed through analog circuitry includes providing noise reduction circuitry to reduce signal noise generated by at least one analog circuit element. A first noise threshold associated with the analog circuit element is determined that approximates an amplitude of the signal above which noise reduction generates unacceptable signal distortion. The noise reduction circuitry is adaptively configured based on a comparison of the amplitude of the signal and the first noise threshold by adjusting a rate to apply noise reduction to the signal. The signal is processed through the analog circuitry using the adaptively configured noise reduction circuitry to reduce noise in the signal without introducing unwanted distortion.

In one embodiment, the noise reduction circuitry includes chopping circuitry and the method includes reducing a chopping rate if the signal amplitude is greater than the first noise threshold. In another embodiment, the application of the noise reduction for the signal is stopped if the amplitude is greater than the first noise threshold.

Distortion reduction circuitry may also be provided to reduce signal distortion generated by a plurality of analog circuit elements. A first distortion threshold associated with the plurality of analog circuit elements is determined by approximating an amplitude of the signal below which distortion reduction generates unacceptable signal noise. The distortion reduction circuitry is adaptively configured based on a comparison of the amplitude of the signal and the first distortion threshold by adjusting a rate to apply distortion reduction to the signal. The signal is processed through the analog circuitry using the adaptively configured distortion reduction circuitry to reduce distortion in the signal without introducing unwanted signal noise.

In one embodiment, the distortion reduction circuitry comprises dynamic element matching circuitry and the method further includes reducing the rate of dynamic element matching if the signal amplitude is less than the first distortion threshold. In another embodiment, a plurality of distortion thresholds for a plurality of analog circuit elements are set, each of the distortion thresholds having a corresponding rate. The amplitude of the signal is compared to at least one of the plurality of distortion thresholds and the distortion reduction circuitry is adaptively configured to apply distortion reduction to the signal at the corresponding rate.

In another embodiment, an electronic system includes analog processing circuitry comprising a plurality of circuit elements, the analog processing circuitry configured to receive and process an input signal. The system further includes distortion reduction circuitry, a distortion control module, noise reduction circuitry, and a noise control module. In one embodiment, the system includes a digital signal processor configured to determine the amplitude of the input signal.

The distortion reduction circuitry is coupled to the analog processing circuitry and arranged to provide distortion reduction to a first subset of the plurality of circuit elements at a first rate. The distortion control module is configured to adaptively adjust the first rate of distortion reduction based on a comparison of an amplitude of the input signal to a first threshold. In one embodiment, the distortion reduction circuitry (e.g., dynamic element matching circuitry) is further configured to, based on the signal amplitude being less than first threshold value, stop application of the distortion reduction. In another embodiment, the distortion control module is further configured to compare the amplitude to a plurality of threshold step values, and based on the amplitude being less than at least one of the plurality of threshold step values, adaptively reducing the first rate of distortion reduction.

The noise reduction circuitry is coupled to the analog processing circuitry and arranged to provide noise reduction to a second subset of the plurality of circuit elements at a second rate. The noise control module is configured to adaptively adjust the second rate of noise reduction based on a comparison of the amplitude of the input signal to a second threshold. In one embodiment, the noise reduction circuitry (e.g., chopping circuitry) is further configured to, based on the amplitude being greater than the second threshold, stop application of the noise reduction. In another embodiment, the noise control module is further configured to compare the amplitude to a plurality of threshold step values, and based on the amplitude being greater than at least one of the plurality of threshold step values, adaptively reducing the second rate of noise reduction.

In another embodiment, a method for reducing distortion in a signal processed through analog circuitry comprises providing distortion reduction circuitry to reduce signal distortion generated by a plurality of analog circuit elements, setting a first distortion threshold for the plurality of analog circuit elements, the first distortion threshold approximating an amplitude of the signal below which distortion reduction generates unacceptable signal noise, and adaptively configuring the distortion reduction circuitry based on a comparison of the amplitude of the signal and the first distortion threshold by adjusting a rate to apply distortion reduction to the signal. The signal is processed through the analog circuitry using the adaptively configured distortion reduction circuitry to reduce distortion in the signal.

In various embodiments, the method for distortion reduction may further comprise reducing a scrambling rate of dynamic element matching circuitry if the signal amplitude is less than the first distortion threshold, or if the amplitude is less than the first distortion threshold, stopping the application of the distortion reduction for the signal.

In various embodiments, the method may further comprise setting a first noise threshold for at least one analog circuit element, the first noise threshold approximating an amplitude of the signal above which noise reduction generates unacceptable signal distortion, adaptively configuring noise reduction circuitry based on a comparison of the amplitude of the signal and the first noise threshold to adjust a rate to apply noise reduction to the signal, and processing the signal through the analog circuitry using the configured noise reduction circuitry to reduce noise in the signal. In one embodiment, the noise reduction may include chopping circuitry that is adaptively configured to reduce the rate of chopping if the signal amplitude is greater than the first noise threshold.

In some embodiments, the noise reduction may further comprise setting a plurality of noise thresholds for at least one analog circuit element, the plurality of noise thresholds approximating an amplitude of the signal below which noise reduction generates unacceptable signal distortion at corresponding rates of noise reduction, and comparing the amplitude to at least one of a plurality of threshold step values and adaptively configuring the noise reduction circuitry to apply noise reduction to the signal at a corresponding rate.

The scope of the invention is defined by the claims, which are incorporated into this section by reference. A more complete understanding of embodiments of the present invention will be afforded to those skilled in the art, as well as a realization of additional advantages thereof, by a consideration of the following detailed description. Reference will be made to the appended sheet of drawings that will first be described briefly.

The included drawings are for illustrative purposes and serve only to provide examples of possible systems and methods. These drawings in no way limit any changes in form and detail that may be made to that which is disclosed by one skilled in the art without departing from the spirit and scope of this disclosure.

DETAILED DESCRIPTION

The present disclosure describes methods and systems that address a need in the art of signal processing for reducing both noise and distortion in such a way that the processing of the input signal minimizes increased noise when reducing distortion and minimizes increased distortion when reducing noise.

In one embodiment, the frequency or frequencies at which noise and distortion reduction techniques are applied are adaptively adjusted based on the amplitude of the input signal. For example, when input signal amplitude is detected to be lower than a certain threshold voltage, a distortion reduction technique can be implemented at a lower frequency. The distortion reduction technique can be completely stopped after the input signal crosses below a second threshold. When the input signal amplitude is detected to be higher than a certain threshold, a noise reduction technique can be implemented at a lower frequency, and, for a high-enough threshold, the noise reduction technique can even be completely stopped after the input signal crosses that threshold.

Embodiments of the present disclosure may be contrasted to pre-existing solutions for reducing distortion in signal processing that use dynamic element matching (DEM). Such solutions typically route the input signal through an encoder or scrambler to reduce distortion by rotating, in a random way, the circuit elements used for processing the input signal. So, for example, DEM can reduce distortion due to capacitor mismatch in a switched capacitor-based analog-to-digital converter (ADC) or digital-to-analog converter (DAC). Also, for example, DEM can reduce distortion due to current cell mismatches in a switched current based ADC or DAC.

Such distortion reduction, however, typically comes at a cost of creating noise and reducing dynamic range of the signal. DEM can add noise to the signal due to coupling of switching nodes to outputs and due to the rotating use of mismatched elements (e.g., capacitors, current cells in the foregoing examples). DEM can be described as converting a distortion of the signal from a nonlinear distortion to either white or spectrally shaped pseudorandom noise that is uncorrelated with the input signal. Thus, the more often DEM is applied to the input signal, the more noise will be created.

Embodiments of the present disclosure also may be contrasted to pre-existing solutions for reducing noise in signal processing that use chopping. Such solutions typically are used to reduce low frequency noise, which may include, for example, any or all of de offset of the signal, 1/f noise (e.g., having a power spectral density (PSD) inversely proportional to frequency), or flicker noise. Such solutions typically reduce low frequency noise by applying modulation to the input signal to transpose the signal to a higher frequency band where there is no low frequency noise, and then demodulates the signal back to the baseband (original frequency band of the input signal) after amplification or other processing. Such noise reduction typically comes, however, at a cost of increased distortion, especially for a larger amplitude signal, because internal nodes along the signal path need to resettle to their new values in the presence of a continuous signal. Thus, the more often chopping techniques are applied to the internal circuits of the input signal processing, the more distortion will be created.

In accordance with embodiments of the present disclosure, distortion reduction (e.g., DEM) and noise reduction (e.g., chopping) may be adjusted based on input signal amplitude, so that DEM can be used to reduce distortion without negatively impacting the noise in the processed signal from the input signal, and chopping can be used to reduce noise without negatively impacting the total harmonic distortion (THD) measurement for the processing circuitry.

In addition, embodiments can be implemented together or along with other techniques to reduce noise or distortion even further. Such other techniques may include, for example, reducing noise by increasing device size or increasing current, reducing distortion by increasing circuit gain or improving element matching. Moreover, it is contemplated that in various embodiments a circuit in accordance with the present disclosure may implement only one of the distortion control or noise control techniques described herein, or that each can be implemented independently on a device.

Figure 1:
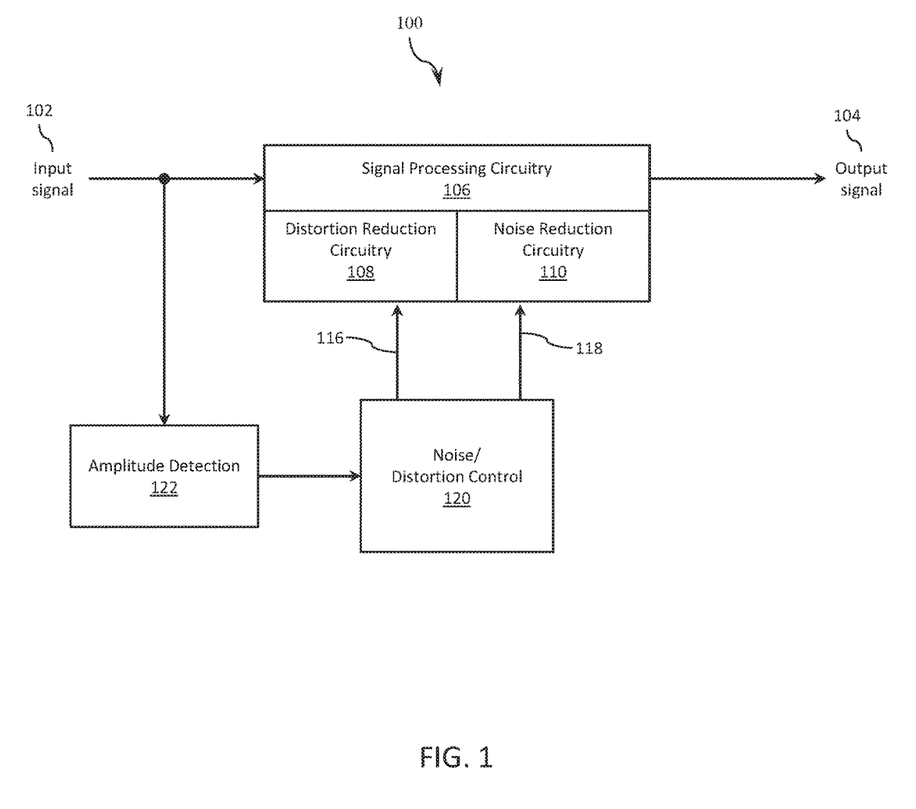
FIG. 1 is a block diagram of a noise and distortion reduction system in accordance with an embodiment of the present invention.

FIG. 1 is a block diagram illustrating circuitry 100 applying noise and distortion reduction according to one or more embodiments. As seen in FIG. 1, circuitry 100 receives an input signal 102, which is provided to signal processing circuitry 106. It will be appreciated that, in alternate embodiments, the signal processing circuitry 106 may include any analog circuitry introducing unwanted noise and distortion in the signal path. In one embodiment, the input signal 102 is a digital audio signal and the signal processing circuitry 106 includes a digital-to-analog converter. In an alternative embodiment, the input signal 102 is an analog audio signal and the signal processing circuitry 106 includes an analog-to-digital converter.

As illustrated in FIG. 1, the signal processing circuitry 106 is coupled to distortion reduction circuitry 108 and noise reduction circuitry 110. Input signal 102 is also supplied to amplitude detection block 122 which provides signal amplitude values to noise/distortion control module 120. Noise/distortion control module 120 controls the noise and distortion reduction applied through the signal processing circuitry 106.

In one embodiment, the noise/distortion control 120 compares the detected amplitude to one or more threshold values to determine whether output signal 104 is likely to include unwanted distortion from the noise reduction circuitry 110 or unwanted noise from the distortion reduction circuitry 108. The noise/distortion control module 120 may then provide a distortion reduction control signal 116 to the distortion reduction circuitry 108 and a noise reduction control signal 118 to noise reduction circuitry 110 in accordance with the threshold determinations. The control signals (116 & 118) may be, for example, a voltage level, an analog signal such as a waveform or pulse-width modulated signal, a digital signal, or other signal for controlling circuitry.

In various embodiments, the distortion reduction signal 116 may configure the distortion reduction circuitry 108 to stop distortion reduction, to reduce the frequency of distortion reduction, or to implement full distortion reduction on the signal. For example, it is recognized that total harmonic distortion generally increases with signal amplitude, and that distortion reduction is beneficial for the reduction of overall total harmonic distortion plus noise (THD+N) at higher signal amplitudes. However, at lower amplitudes, the THD+N may increase due to an increase in noise. A first distortion threshold can be set such that above the corresponding amplitude value, the distortion reduction circuitry 108 operates to reduce unwanted distortion. A second distortion threshold can be set such that above the corresponding amplitude value, the effect of distortion reduction on THD+N is more sensitive to the residual noise generated from the distortion reduction circuitry 108. In such a case, the distortion reduction technique is implemented at a reduced rate, resulting in a reduction of residual noise from the distortion reduction circuitry. In one embodiment, if the amplitude of the input signal is below the second threshold, then distortion reduction 108 may be bypassed altogether, such as by setting the scrambler to a fixed state. In various embodiments, the distortion reduction technique may be stepped or ramped up or down as the signal amplitude varies between the two thresholds to implement a plurality of intermediate distortion reduction levels.

In various embodiments, the noise reduction control signal 118 may configure the noise reduction circuitry 110 to stop noise reduction, to reduce the frequency of noise reduction, or to implement full noise reduction on the signal. For example, it is recognized that noise generally degrades the signal quality as signal amplitude decreases, and that noise reduction circuitry may add to unwanted distortion at higher signal amplitudes. A first noise threshold can be set such that below the corresponding amplitude value, the noise reduction circuitry 110 is expected to reduce noise without adding unwanted distortion. A second noise threshold value can be set such that, below that amplitude value, the noise reduction technique can be implemented at a reduced rate to limit the impact of unwanted distortion. If the amplitude of the input signal is above the second threshold, then noise reduction may be stopped altogether to avoid signal degrading distortion. In various embodiments, the noise reduction technique may be stepped or ramped up or down as the signal amplitude varies between the two thresholds to implement a plurality of intermediate noise reduction levels.

In one embodiment, the distortion reduction module 108 includes dynamic element matching (DEM) circuitry which may include, for example, scrambling circuitry and a plurality of switches for switching the signal path through the signal processing circuitry 106 and the distortion reduction circuitry 108 in order to configure the application of distortion reduction in accordance with the distortion control signal 116. In one embodiment, the signal processing circuitry 106 includes a sigma-delta analog to digital converter including a sigma-delta modulator, dynamic element matching circuitry, an internal DAC feedback loop, and a digital filter which produces a digital output signal. In such embodiment, the dynamic element matching may operate to randomize mismatched components of the analog elements of the internal DAC. For example, dynamic element matching may be implemented using a scrambler that pseudo-randomly matches different circuit elements at different times to effectively cancel out the effects of component mismatch of the elements on the overall signal.

The noise/distortion control module 120 may apply or cease to apply dynamic element matching by controlling and adjusting the DEM switching frequency (via control signal 116 and switches). In one embodiment, the control signal 116 gradually reduces the scrambling frequency as a function of signal amplitude. The control signal 116 may cease operation of the DEM (e.g., when amplitude of the signal is below a threshold) by setting the scrambler in a fixed state. Dynamic element matching circuits and techniques suitable for the present embodiment are known in the art such as described in U.S. Pat. No. 6,384,761 (Melanson) and U.S. Pat. No. 7,511,647 (Ido et. al), which are hereby incorporated by reference.

The noise reduction circuitry 110 may include, for example, a plurality of switches for switching the signal path through signal processing circuitry 106 and noise reduction circuitry 110 in order to apply or not apply chopping or other noise reduction techniques to the processing of input signal 102 into output signal 104. For example, chopping may be implemented by routing the signal through a modulator that applies modulation to the signal to transpose the signal to a higher frequency band, routing the higher frequency signal through one or more circuit elements (such as an amplifier), and then demodulating the signal back to the baseband to provide output signal 104. The noise/distortion control 120 may apply or cease to apply a chopping technique by controlling and adjusting a switching frequency of the chopping circuitry (e.g., via control signal 118 and switches). In one embodiment, the control signal 118 gradually reduces the chopping frequency as a function of signal amplitude. The control signal 118 may cease operation of the chopping technique (e.g., when amplitude of the signal is above a threshold) by setting the chopping circuitry to a fixed state. Various chopping stabilization techniques suitable for present embodiment are described in "Circuit Techniques for Reducing the Effects of Op-Amp Imperfections, Autozeroing, Correlated Double Sampling, and Chopper Stabilization," Christian C. Enz and Gabor C. Temes, Proceedings of the IEEE, Vol. 84, No. 11, November 1996, which is hereby incorporated by reference.

Noise/distortion control module 120, distortion reduction circuitry 108 (e.g., dynamic element matching circuitry), and noise reduction circuitry 110 (e.g., chopping circuitry) may operate in conjunction with each other, as illustrated in FIG. 1. In general, in a system for electronic processing of analog signals such as system 100, distortion increases as input signal amplitude increases. For example, for a fully differential system which is typically dominated by third order harmonic distortion, distortion increases approximately 18 dB for every 6 dB increase of signal amplitude. Therefore, when the signal level (amplitude) is high, distortion related non-ideality is typically higher than noise related non-ideality. When the signal level is low, noise related non-ideality is typically higher than distortion related non-ideality. Therefore, system 100 can operate to adaptively configure the application of the distortion reduction (e.g., DEM) and noise reduction (e.g., chopping) techniques to the higher non-ideality based on input signal amplitude compared to one or more threshold values and can reduce both noise and distortion in such a way that the processing of the input signal does not increase noise when reducing distortion and does not increase distortion when reducing noise.

In one embodiment, for example, when the amplitude of the input signal 102 is detected to be lower than a first distortion threshold voltage, DEM (distortion reduction) may be applied at a lower frequency or stopped altogether. In addition, application of DEM may also be started or re-started after the input signal amplitude crosses (rises above) a certain threshold, which may be the same or distinct from the first distortion threshold. Changing the frequency at which DEM is applied does not create a discontinuity at the output signal (e.g., output signal 104). Therefore, adjustment of the DEM frequency can be performed on a continuous multi-step basis, for example, by adjusting the DEM frequency as the signal amplitude crosses each of a number of pre-specified threshold step values.

At the same time, for noise reduction, when signal amplitude is detected to be higher than a first noise threshold voltage, chopping may be applied at a lower frequency. Alternatively or in addition, application of chopping may be stopped after the signal amplitude's crossing (rising above) a second noise threshold. In addition, application of chopping may also be started or re-started after the input signal amplitude crosses (drops below) a certain threshold, which may be the same or distinct from the second noise threshold. Moreover, changing the frequency at which chopping is applied does not create a discontinuity at the output signal (e.g., output signal 104). Therefore, adjustment of the chopping frequency can be performed on a continuous multi-step basis, for example, by adjusting the chopping frequency as the signal amplitude crosses each of a number of pre-specified threshold step values.

Figure 2:
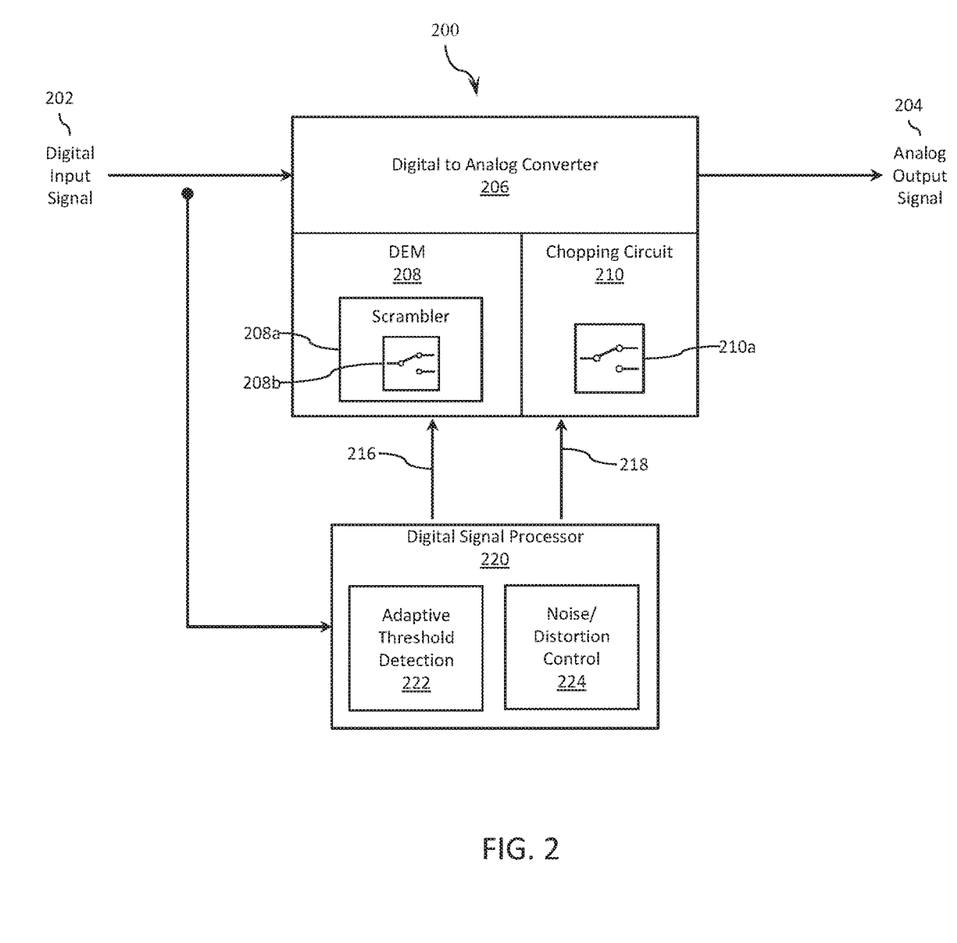
FIG. 2 is a block diagram of a noise and distortion reduction system in accordance with an embodiment of the present invention.

FIG. 2 illustrates an electronic system 200 for converting a digital input signal 202 to an analog output signal 204 and applying noise and distortion reduction in accordance with an alternative embodiment. In various embodiments, the system 200 may be any electronic device, such as an audio codec, smartphone, tablet, television or computer. The system 200 includes digital and analog circuitry for signal processing and other electronic circuits as customarily implemented in such systems.

As illustrated, the signal processing circuitry includes a digital to analog converter 206, dynamic element matching circuitry 208 and chopping circuitry 210. Digital input signal 202 is fed to the digital to analog converter 206 which produces the analog output signal 204, which may be provided on output device, such as an audio loudspeaker. The digital input signal 202 is also provided to a digital signal processor 220 that includes adaptive threshold detection logic 222 and noise/distortion control logic 224. The adaptive threshold detection logic 222 receives the digital input signal 202, determines relevant signal level information (e.g., the amplitude of input signal 202) and compares the signal level to one or more thresholds.

Noise/distortion control 224 provides a distortion reduction signal 216 to the DEM module 208 for distortion reduction. Distortion reduction signal 216 may be, for example, a voltage level, an analog signal such as a waveform or pulse-width modulated signal, a digital signal, or other control signal. Distortion reduction signal 216 may convey information from noise/distortion control 224 as to a frequency with which the distortion reduction module (e.g., DEM module 208) should apply a distortion reducing technique, including whether to start or stop application of the technique.

Noise/distortion control module 224 also provides a noise reduction signal 218 to chopping circuit 210 to control the reduction of unwanted noise generated by digital to analog converter 206. In one embodiment, the digital to analog converter 206 is a current output digital to analog converter that supplies a current to a chopped differential amplifier. In operation, the chopped differential amplifier modulates the signal to a higher frequency, amplifies the signal and then demodulates the signal back to the original band thereby reducing 1/f noise. Noise reduction signal 218 may be, for example, a voltage level, an analog signal such as a waveform or pulse-width modulated signal, a digital signal, or other control signal. Noise reduction signal 218 may convey information from noise/distortion control 224 as to the result of comparing amplitude value to a certain noise threshold value—which may be the same as or distinct from the threshold value used for distortion reduction—or any of a number of threshold step values—which also may be the same as or distinct from the threshold step values used for distortion reduction. Noise reduction signal 218 may convey information as to a frequency with which the chopping circuit 210 should apply a noise reducing technique, including whether to start or stop application of the technique.

DEM module 208 may include, for example, a scrambler 208a and plurality of switching elements 208b integrated with the DAC circuitry 206 in order to apply or not apply dynamic element matching to the processing of input signal 202 into output signal 204. For example, DEM may be implemented so as to pseudorandomly select different circuit elements at different times that effectively cancel out the effects of component mismatch of the elements on the overall signal. DEM module 208 may apply or cease to apply a dynamic element matching technique by changing the frequency of the DEM switching in accordance with the distortion reduction signal 216.

Chopping circuit 210 may include, for example, a plurality of switches 210a in order to apply or not apply chopping to the processing of input signal 202 into output signal 204. For example, chopping may be implemented by routing the signal through a modulator that applies modulation to the signal to transpose the signal to a higher frequency band, routing the higher frequency signal through an analog component, such as an amplifier, and then demodulating the signal back to the baseband to provide output signal 204. Chopping circuit 210 may apply or cease to apply a chopping technique by changing the chopping frequency through the plurality of switches 210a.

Adaptive threshold detection module 222, Noise/Distortion Control 224, DEM circuitry 208, and chopping circuit 210 may operate in conjunction with each other, as described above, to adaptively configure, based on digital input signal 202 amplitude compared to one or more threshold values, application of the DEM 208 for distortion reduction and the chopping circuit 210 for noise reduction, in such a way that the processing of the digital input signal 202 does not increase unwanted noise when reducing distortion and does not increase unwanted distortion when reducing noise.

As described above, the frequency of application of distortion reduction may be reduced, or application of DEM even stopped, the lower the amplitude of the input signal 202 as may be indicated by the amplitude being lower than or dropping below a certain threshold or threshold step value, and conversely, the DEM frequency may be increased, or application of DEM started or re-started, the higher the amplitude of the input signal 202 as may be indicated by comparison of the amplitude to various specific values. At the same time, the frequency of application of noise reduction (chopping frequency) may be reduced, or application of chopping even stopped, the higher the amplitude of the input signal 202 as may be indicated by the amplitude being higher than or rising above a certain threshold or threshold step value, and conversely, the chopping frequency may be increased, or application of chopping started or re-started, the lower the amplitude of the input signal 202 as may be indicated by comparison of the amplitude to various specific values or thresholds.

Figure 3:
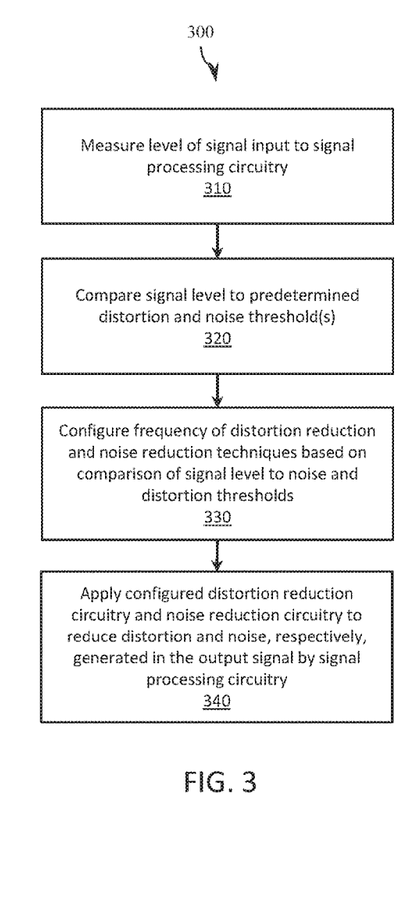
FIG. 3 is a flow chart of a method for noise and distortion reduction according to an embodiment of the present invention.

FIG. 3 is a flow chart illustrating a method 300 for noise and distortion reduction in an electronic system according to one or more embodiments. Method 300 includes operations for determining an amplitude of an input signal (step 310) and comparing the amplitude to one or more threshold values (step 320). Such operations may be performed, for example, by noise/distortion control circuitry 120, adaptive threshold detection module 122, or DSP 220. Method 300 may further include operations (step 330) of configuring both distortion reduction circuitry and noise reduction circuitry to reduce both distortion and noise, while minimizing unwanted noise and distortion created by such circuitry. Method 300 may further include operations (step 340) of applying the configured distortion reduction circuitry at an adaptively adjusted distortion reduction frequency (including starting and stopping application of the technique) and applying the configured noise reducing circuitry at an adaptively adjusted second noise reduction frequency (including starting and stopping application of the noise reducing technique) to generate an output signal with reduced distortion and noise.

Figure 4:
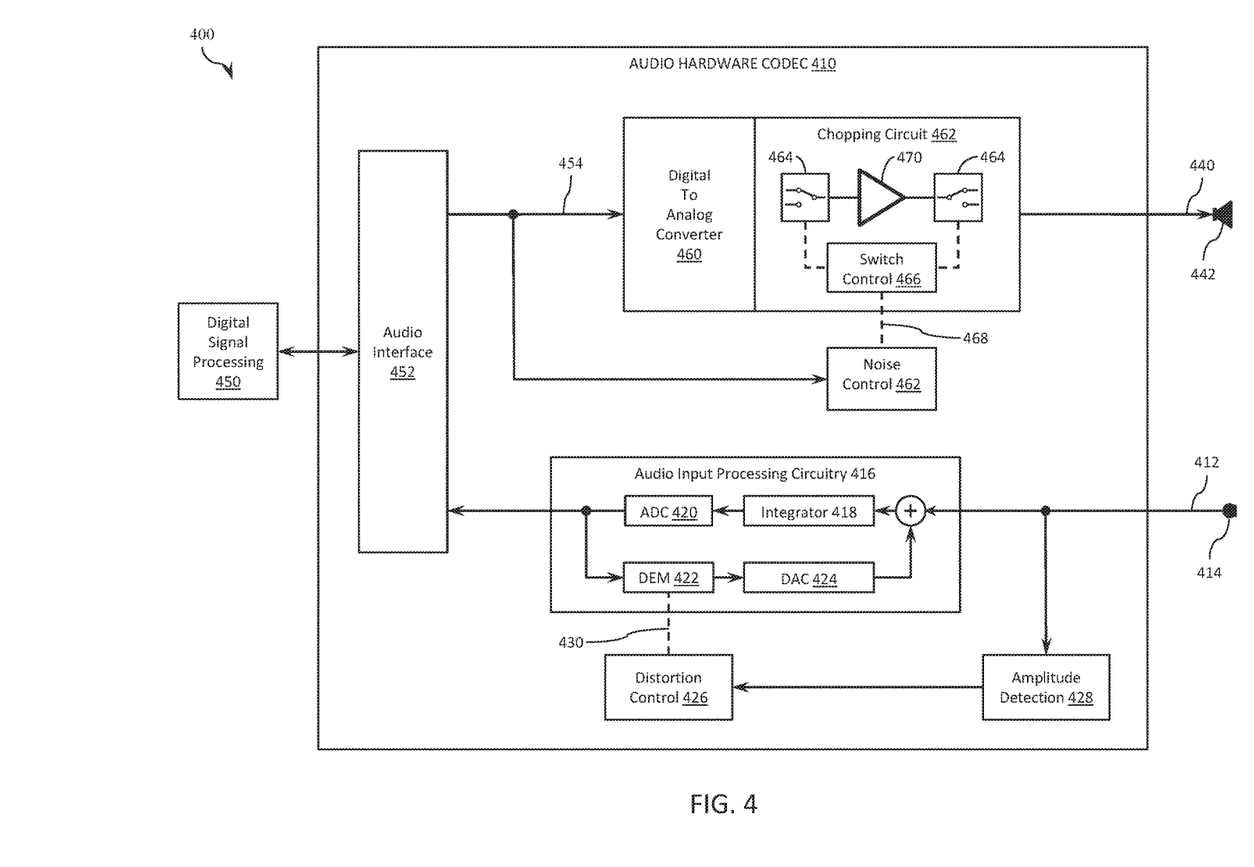
FIG. 4 is a block diagram of an audio hardware codec including circuitry for noise and distortion reduction in accordance with an embodiment of the present invention.

FIG. 4 illustrates an electronic system 400 for electronic processing of analog signals including noise and distortion reduction in accordance with an alternate embodiment. As illustrated, system 400 includes an audio hardware codec 410 providing analog and digital circuitry for audio input and output. The codec 410 receives an analog input signal 412 from a signal source 414. The signal source 414 may be, for example, any electronic device such as a smartphone or tablet, or a sensor such as a microphone. Signal source 414 may provide input signal 412 to audio input processing circuitry 416, which may provide signal buffering, analog-to-digital conversion (such as through an analog-to-digital converter), noise reduction and other analog signal processing.

The audio hardware codec 410 may include circuitry to process input signal 412, provide output signal 440 and control the noise reduction and distortion reduction operations described herein with reference to any of FIG. 1, 2, or 3, to adaptively configure audio hardware codec 410 to reduce noise and distortion in the analog circuit components of codec 410.

In the illustrated embodiment, for example, analog to digital circuitry is provided including an integrator 418, analog-to-digital conversion circuitry 420, and digital to analog conversion circuitry 424 providing feedback to the ADC 420. In one embodiment, the DAC 424 includes a plurality of unit DACs that are pseudorandomly mapped to an encoded signal by the DEM 422 which controls switching circuitry within the DAC 424. In one embodiment, the DEM 422 is further controlled by distortion control 426, which receives an amplitude of the input signal 412 from amplitude detection module 428, compares the amplitude to at least one distortion threshold, and generates a control signal 430 to variably control the frequency of the DEM switching. In various embodiments, the distortion control 426 configures the DEM 422 to select a fixed mapping if the amplitude of the signal 424 is below a first distortion threshold, configure dynamic element matching at a low rate when the amplitude of the signal is between the first distortion threshold and a second distortion threshold, and enable full dynamic element matching if the amplitude of the signal is above the second distortion threshold. By controlling the rate of distortion reduction based on signal amplitude compared to one or more threshold values established for the DAC 424 circuitry, distortion reduction may be implemented with less unwanted noise than conventional systems.

The codec 410 may also provide output signal 440 to an output device 442. Output signal 440 may be generated from the input signal 412, by a digital signal processing module 450, or from another audio source such as an audio file on system 400. The output device may be a loudspeaker, headphones or another electronic device for receiving the audio signal 440.

Codec 410 may include an audio interface 452 or other communication mechanism for communicating data, signals, and information between various components and modules of codec 410, digital signal processing module 450 and other components and modules of system 400. System 400 may perform specific operations through digital signal processing module 450, which may execute one or more sequences of instructions stored in a memory. Logic may be encoded in a computer readable medium, which may take many forms, including but not limited to, non-volatile media, volatile media, and transmission media. The digital signal processing module 450 can be a micro-controller, dedicated digital signal processor or general purpose processor used to control and facilitate the operation of system 400. It may be understood that the various components of system 400 may reside in a single device or multiple devices, which may be coupled by a communications link.

As illustrated, the codec 410 further includes a digital to analog converter 460 (DAC) that converts a digital output signal 454 to an analog output signal 440. In one embodiment, the analog output of the DAC 460 is provided to an amplifier 470, which is implemented within a chopping circuit 462 for noise reduction. In operation, the chopping circuit 462 includes a plurality of switches 464 and a switch control 466 that repeatedly switches the input and output of amplifier 470 to reduce noise. Noise control 462 provides further control of the chopping circuit 462 to reduce noise without introducing unwanted signal distortion, for example, by configuring the switch control 466 to reduce the frequency of switching, or cease switching altogether, based on an amplitude of the digital signal 454. Chopping circuit 462 may include known analog signal chopping techniques which may be variably adjusted as described herein with via control signal 468. After noise reduction, the analog signal 440 may be output, such as to a loudspeaker 442.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method for reducing noise in a signal processed through analog circuitry, the method comprising:
   providing noise reduction circuitry to reduce signal noise generated by at least one analog circuit element;
   setting a first noise threshold associated with the analog circuit element, the first noise threshold approximating an amplitude of the signal above which noise reduction generates unacceptable signal distortion;
   adaptively configuring the noise reduction circuitry based on a comparison of the amplitude of the signal and the first noise threshold by adjusting a rate to apply noise reduction to the signal; and
   processing the signal through the analog circuitry using the adaptively configured noise reduction circuitry to reduce noise in the signal.

2. The method of claim 1, wherein the noise reduction circuitry comprises chopping circuitry and adaptively configuring the noise reduction circuitry comprises reducing a chopping rate if the signal amplitude is greater than the first noise threshold.

3. The method of claim 1, wherein if the amplitude is greater than the first noise threshold, adaptively configuring the noise reduction circuitry comprises stopping the application of the noise reduction for the signal.

4. The method of claim 1, further comprising:
   providing distortion reduction circuitry to reduce signal distortion generated by a plurality of analog circuit elements;
   setting a first distortion threshold associated with the plurality of analog circuit elements, the first distortion threshold approximating an amplitude of the signal below which distortion reduction generates unacceptable signal noise;
   adaptively configuring the distortion reduction circuitry based on a comparison of the amplitude of the signal and the first distortion threshold by adjusting a rate to apply distortion reduction to the signal; and
   processing the signal through the analog circuitry using the adaptively configured distortion reduction circuitry to reduce distortion in the signal.

5. The method of claim 4 wherein the distortion reduction circuitry comprises dynamic element matching circuitry, and wherein adaptively configuring the distortion reduction circuitry comprises reducing the rate of dynamic element matching if the signal amplitude is less than the first distortion threshold.

6. The method of claim 4, further comprising:
   setting a plurality of distortion thresholds for the plurality of analog circuit elements, each of the distortion thresholds having a corresponding rate; and
   comparing the amplitude to at least one of the plurality of distortion thresholds and adaptively configuring the distortion reduction circuitry to apply distortion reduction to the signal at the corresponding rate.

7. An electronic system comprising:
   analog processing circuitry comprising a plurality of circuit elements, the analog processing circuitry configured to receive and process an input signal;
   distortion reduction circuitry coupled to the analog processing circuitry and arranged to provide distortion reduction to a first subset of the plurality of circuit elements at a first rate;
   noise reduction circuitry coupled to the analog processing circuitry and arranged to provide noise reduction to a second subset of the plurality of circuit elements at a second rate;
   a distortion control module configured to adaptively adjust the first rate of distortion reduction based on a comparison of an amplitude of the input signal to a first threshold; and
   a noise control module configured to adaptively adjust the second rate of noise reduction based on a comparison of the amplitude of the input signal to a second threshold.

8. The electronic system of claim 7, wherein the distortion reduction circuitry is further configured to, based on the signal amplitude being less than the first threshold value, stop application of the distortion reduction.

9. The electronic system of claim 7, wherein the noise reduction circuitry is further configured to, based on the amplitude being greater than the second threshold, stop application of the noise reduction.

10. The electronic system of claim 7, wherein the distortion control module is further configured to compare the amplitude to a plurality of threshold step values, and based on the amplitude being less than the at least one of the plurality of threshold step values, adaptively reducing the first rate of distortion reduction.

11. The electronic system of claim 7, wherein the noise control module is further configured to compare the amplitude to a plurality of threshold step values, and based on the amplitude being greater than at least one of the plurality of threshold step values, adaptively reducing the second rate of noise reduction.

12. The electronic system of claim 7, wherein the distortion reduction circuitry is dynamic element matching circuitry.

13. The electronic system of claim 7, wherein the noise reducing circuitry is chopping circuitry.

14. The electronic system of claim 7, further comprising:
a digital signal processor configured to determine the amplitude of the input signal.

15. A method for reducing distortion in a signal processed through analog circuitry, the method comprising:
providing distortion reduction circuitry to reduce signal distortion generated by a plurality of analog circuit elements;
setting a first distortion threshold for the plurality of analog circuit elements, the first distortion threshold approximating an amplitude of the signal below which distortion reduction generates unacceptable signal noise;
adaptively configuring the distortion reduction circuitry based on a comparison of the amplitude of the signal and the first distortion threshold by adjusting a rate to apply distortion reduction to the signal; and
processing the signal through the analog circuitry using the adaptively configured distortion reduction circuitry to reduce distortion in the signal.

16. The method of claim 15, wherein the distortion reduction circuitry comprises dynamic element matching circuitry and configuration of the distortion reduction circuitry comprises reducing a scrambling rate of the dynamic element matching if the signal amplitude is less than the first distortion threshold.

17. The method of claim 15, wherein if the amplitude is less than the first distortion threshold, adaptively configuring the distortion reduction circuitry comprises stopping the application of the distortion reduction for the signal.

18. The method of claim 15, further comprising:
providing noise reduction circuitry to reduce signal noise generated by at least one analog circuit element;
setting a first noise threshold for the at least one analog circuit element, the first noise threshold approximating an amplitude of the signal above which noise reduction generates unacceptable signal distortion;
adaptively configuring noise reduction circuitry based on a comparison of the amplitude of the signal and the first noise threshold to adjust a rate to apply noise reduction to the signal; and
processing the signal through the analog circuitry using the configured noise reduction circuitry to reduce noise in the signal.

19. The method of claim 18 wherein the noise reduction circuitry comprises chopping circuitry and adaptively configuring the noise reduction circuitry comprises reducing the rate of chopping if the signal amplitude is greater than the first noise threshold.

20. The method of claim 18, further comprising:
setting a plurality of noise thresholds for the at least one analog circuit element, the plurality of noise thresholds approximating an amplitude of the signal below which noise reduction generates unacceptable signal distortion at corresponding rates of noise reduction; and
comparing the amplitude to at least one of a plurality of threshold step values and adaptively configuring the noise reduction circuitry to apply noise reduction to the signal at a corresponding rate.

* * * * *